United States Patent
Chew et al.

(10) Patent No.: US 7,639,509 B2
(45) Date of Patent: Dec. 29, 2009

(54) ELECTRONIC DEVICE HAVING A DIMENSIONALLY-STABLE ELECTRICALLY-CONDUCTIVE FLEXIBLE SUBSTRATE

(75) Inventors: Tong Fatt Chew, Penang (MY); Ak Wing Leong, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 417 days.

(21) Appl. No.: 11/431,477

(22) Filed: May 10, 2006

(65) Prior Publication Data

US 2007/0263410 A1 Nov. 15, 2007

(51) Int. Cl.
*H05K 7/00* (2006.01)

(52) U.S. Cl. ............... 361/760; 361/761; 361/728; 361/730; 361/762; 174/260; 174/255

(58) Field of Classification Search ............ 361/760, 361/761, 728, 730, 736, 739, 748–751, 762; 362/613; 174/260–266, 251, 255, 256, 259, 174/50.51, 50.5

See application file for complete search history.

(56) References Cited

U.S. PATENT DOCUMENTS

| | | | |
|---|---|---|---|
| 5,313,365 A * | 5/1994 | Pennisi et al. | 361/760 |
| 7,008,097 B1 * | 3/2006 | Hulse | 362/546 |
| 7,374,327 B2 * | 5/2008 | Schexnaider | 362/613 |
| 2006/0087828 A1 * | 4/2006 | Lin et al. | 362/84 |
| 2006/0092666 A1 * | 5/2006 | Jeong et al. | 362/613 |
| 2006/0262558 A1 * | 11/2006 | Cornelissen | 362/613 |

* cited by examiner

*Primary Examiner*—Dean A. Reichard
*Assistant Examiner*—Hoa C Nguyen

(57) ABSTRACT

The present invention is directed to a dimensionally-stable electronic device such as an LED on flexible printed-circuit-board. The device comprises an electrically-conductive flexible substrate and at least one stabilizing component for dimensionally stabilizing the substrate.

19 Claims, 3 Drawing Sheets

ELECTRONIC DEVICE HAVING A DIMENSIONALLY-STABLE ELECTRICALLY-CONDUCTIVE FLEXIBLE SUBSTRATE

TECHNICAL FIELD

The present invention relates generally to an improved electronic device. More particularly, the invention relates to an electronic device having a dimensionally-stable, electrically-conductive, flexible substrate.

BACKGROUND OF THE INVENTION

Electrical devices are often manufactured using flexible, electrically-conductive substrates. However, parts or layers of the electronic devices can cause dimensional distortion to the substrate. For example, light emitting diodes (LEDs) are often manufactured on substrates called flexible printed circuits ("flex PCs"). A material, such as silicone, is then typically used to encapsulate the LED chip thereby improving both the reliability and the integrity of the unit. The silicone, however, can often adhere to the flex PC substrate and distort the flex PC as the liquid silicone cures and shrinks.

Such substrate distortions negatively impact the performance of the electronic device. For instance, distortions in the substrate may cause the electronic device to function improperly or may make it unsuitable for its desired use. Distortion can be particularly problematic in applications requiring strict dimensional specifications.

BRIEF SUMMARY OF THE INVENTION

The present invention is directed to a dimensionally-stable electronic device comprising an electrically-conductive flexible substrate and at least one stabilizing component for dimensionally stabilizing the substrate.

Example embodiments of the present invention stabilize flexible substrates by affixing rigid material to the substrates. The rigid material may comprise a liquid crystal polymer affixed in at least one strip, a metal plate affixed to the substrate, or other like components that serve to counteract distorting forces.

Alternative embodiments of the present invention place filler material, such as metal oxide or metal nitride, within the substrate thereby increasing the rigidity of the substrate.

Other example embodiments, such as those that use silicone epoxy or other encapsulants, may affix rigid structures above the encapsulants. These rigid structures may also be used to provide other improved features of the devices. For example, in embodiments comprising light emanating diodes, lenses or other functional objects may be used as the rigid structures affixed to provide stability.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
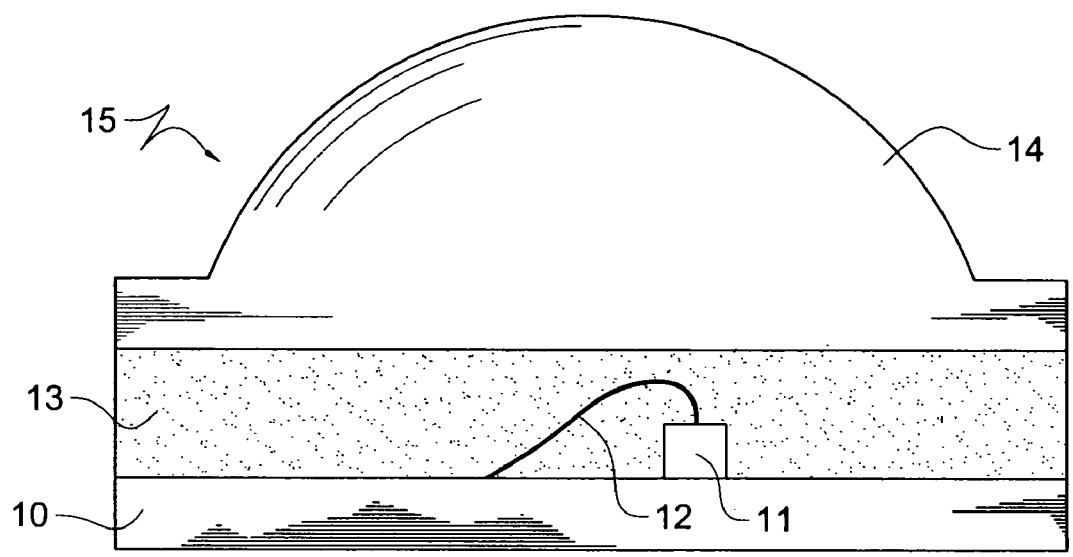
FIG. 1 is an elevation view of one embodiment of the present invention.

The embodiment of the present invention shown in FIG. 1 depicts electrical device 15 comprising a conventional LED light. Conventional LED chip 11 and LED wire 12 are attached to flexible substrate 10, and during the conventional LED manufacture process, a compliant and transparent or translucent material, such as silicone, is placed on top of substrate 10 encapsulating LED chip 11 and LED wire 12. While the example of FIG. 1 uses an LED chip, it will be appreciated by one of ordinary skill in the art that the present invention is not limited to only LED chips.

Substrate 10 of FIG. 1 comprises an electrically-conductive, flexible material. Although substrate 10 may be a variety of materials, substrate 10 comprises, or is similar to, a commercially available flexible printed-circuit-board ("flex PCB," or "flex PC," or "flex circuits") material, such as a dielectric core covered by a flexible copper-clad laminate. Printed-circuit-boards are typically thin materials on which chips and other electronic components are placed and the use of Flex PC herein will be understood to refer to a printed-circuit-board that is flexible, but not limited to any particular type.

Electrical device 15 further comprises dimensionally-distorting component 13 and stabilizing component 14. Dimensionally-distorting component 13 may be any component that tends to distort substrate 10 during or after manufacture. For instance, dimensionally-distorting component 13 may be a component that tends to change shape after application, such as, but not limited to, encapsulants, adhesives, and solders. As used herein, dimensional distortions of the substrate refers to any change in the substrate shape, dimensions, flatness, or tolerance in a height, width, depth, or any combination of height, width, or depth dimension. By way of non-limiting examples, dimensional distortions include a pulling up or pushing down of the corners or edges of substrate 10, scrunching or stretching substrate 10, or creating undesirable undulations in substrate 10.

In the example embodiment of FIG. 1, dimensionally-distorting component 13 comprises a layer or volume of silicone encapsulating LED chip 11. Silicones are synthetic polymers that are frequently referred to as synthetic polymers containing an Si—O—Si backbone wherein each silicon atom bears two methyl groups. While the example described herein uses encapsulant in the broad class of polymers known as silicones, other commercially available compliant and transparent or translucent materials may be used with LEDs arranged according to the present invention.

After application to substrate 10, silicones and other compliant and transparent or translucent materials generally change shape when cured, or through changes induced by external forces, heat, pressure, light radiation, exposure to humidity, and chemicals. In doing so, silicone, or other dimensionally-distorting components, may dimensionally distort substrate 10. To minimize dimensional distortions, the embodiment depicted in FIG. 1 utilizes stabilizing component 14. Stabilizing component 14 may be any component that gives local dimensional stability to electrical device 15, by, for example, reducing a change in one or more dimensions of the substrate. Stabilizing component 14 should not adversely impact the original functionality of electrical device 15 in too great a manner. For example, in the embodiments where the original electrical device was an LED chip, stabilizing component 14 should still allow electrical component to function as an LED chip. In the embodiment depicted in FIG. 1, stabilizing component 14 comprises a relatively high Young's modulus transparent or translucent material, such as, but not limited to, hard silicone or epoxy, capable of bonding with a dimensionally-distorting component 13 silicone having a lower Young's modulus. As used herein, Young's modulus refers to the rigidity of the material in that Young's modulus measures resistance to distortion in connection with an application of force. The lower the Young's modulus, the less rigid the material. Typically, silicone with a lower Young's modulus tends to cause distortions in substrate 10 as it cures by, for example, pulling up at the corners or other edges of substrate 10 or by causing waviness or bunching. Such distortions are not acceptable in applications having strict dimensional tolerances or specifications. In alternative embodiments, stabilizing component 14 comprises a rigid lens or layer that partially or totally covers dimensionally-distorting component 13. As used herein, rigid means a rigidity higher than the rigidity of substrate 10 so as to impart dimensional stabilization to substrate 10.

As will be appreciated by one of ordinary skill in the art, dimensionally-distorting component 13 can be any component placed on or in a potentially distortable relationship to substrate 10 that may tend to change shape or dimension after application.

Figure 2:
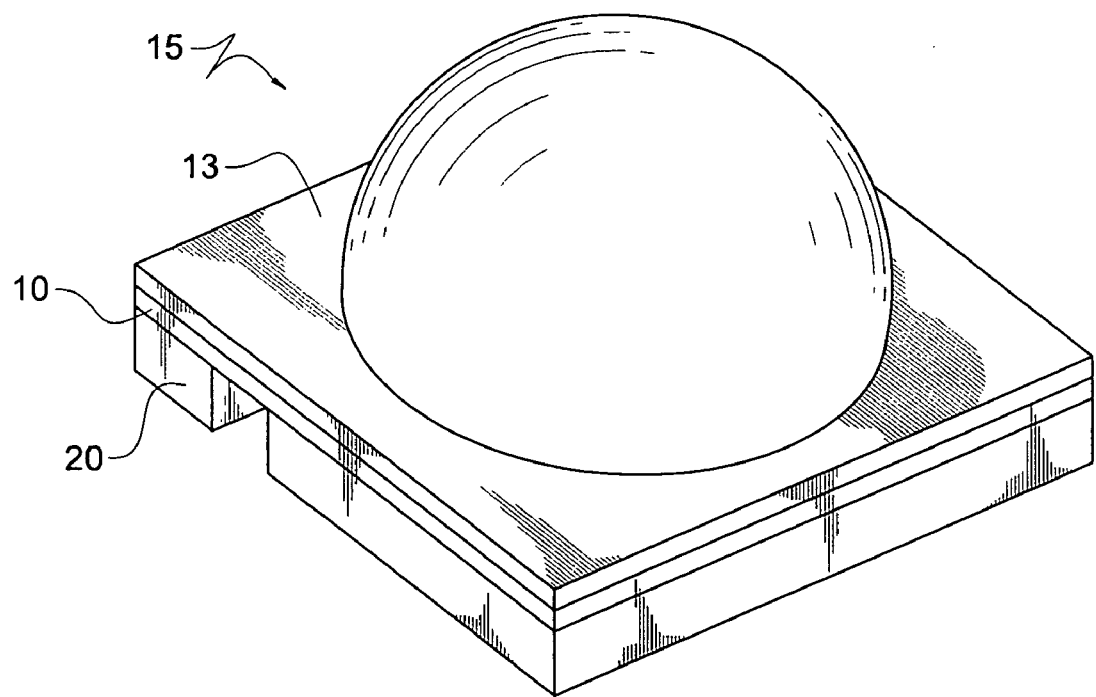
FIG. 2 is a perspective view of one embodiment of the present invention.

FIG. 2 depicts an alternative embodiment in which electrical component 15 comprises a conventional flex LED. While embodiments of the present invention may comprise a dimensionally-distorting component 13 of any shape and material, the depicted embodiment uses a layer of transparent or translucent and compliant material that forms a dome-shaped structure. Stabilizing component 20 comprises at least one metal plate or sheet affixed to the opposite side of substrate 10 compared to dimensionally-distorting component 13. Stabilizing component 20 comprises a metal or alloy that provides a rigidity sufficient to improve the dimensional stability of substrate 10. Stabilizing component 20 may be affixed to substrate 10 by any suitable or commercially available affixing agent, such as, but not limited to, solders, epoxies or silicones, or thermally conductive adhesives. In some embodiments, the affixing agent is electrically-conductive, while in other embodiments, the affixing agent is insulative. In addition, many embodiments may be shaped or adapted to their components in order to meet an application's requirement, for example, in order to avoid shorting the LED circuit when the affixing agent is electrically-conductive. The stabilizing component of an embodiment may alternatively comprise two or more plates separated by free space. The plates of such an embodiment may be of any suitable shape, such as, but not limited to, rectangular, circular, curvilinear or polygonal, and each plate may be any suitable thickness.

Figure 3:
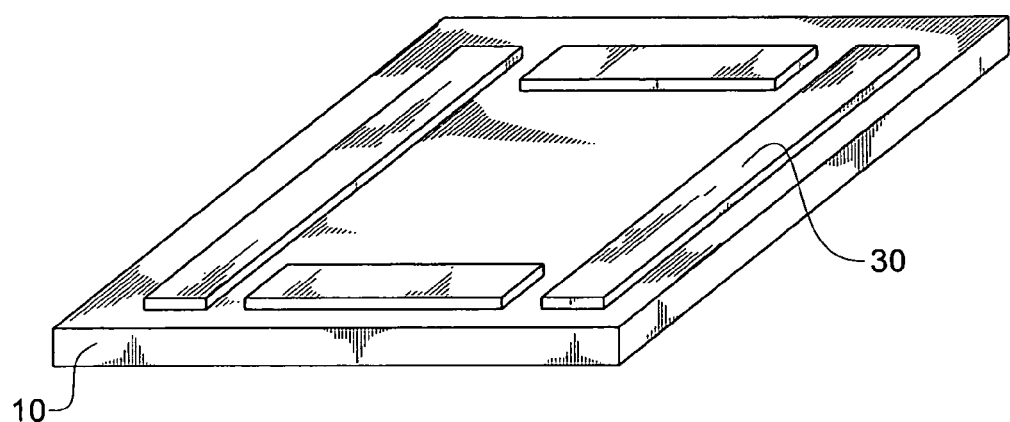
FIG. 3 is a perspective view of one embodiment of the present invention.

FIG. 3 depicts an example embodiment of an electrical component that uses an electrically-conductive, flexible substrate. In the embodiment of FIG. 3, stabilizing components 30 comprise at least one strip of rigid material attached to substrate 10. As used herein, rigid means a rigidity higher than the rigidity of substrate 10 so as to impart dimensional stabilization to substrate 10. Stabilizing component 30 may comprise any suitable material or combination of suitable material, such as, but not limited to, polymers, metals, and metal alloys. In some embodiments, stabilizing component 30 comprises polyimides. Polyimides comprise high temperature engineering polymers exhibiting an advantageous combination of thermal stability, mechanical toughness, and chemical resistance. In other embodiments, stabilizing component 30 comprises liquid crystal polymers. Liquid crystal polymers are a class of materials that combine the properties of polymers with those of liquid crystals. One characteristic of liquid crystal polymers is that they exhibit higher rigidity than many polymers.

In the embodiment depicted in FIG. 3, stabilizing components 30 are cuboid shaped, but other shapes that are within the scope of the invention include, but are not limited to, curvilinear, circular, and ellipsoidal, pyramidal, and polyhedral solids. In addition, stabilizing components 30 may be placed anywhere on substrate 10 that aids in the stabilization of substrate 10. For example, some embodiments may substantially cover the perimeter of substrate 10 with stabilizing components, while other embodiments place stabilizing components over the center of substrate 10. In alternative embodiments, stabilizing components 30 may cover varying portions of substrate 10.

Figure 4:
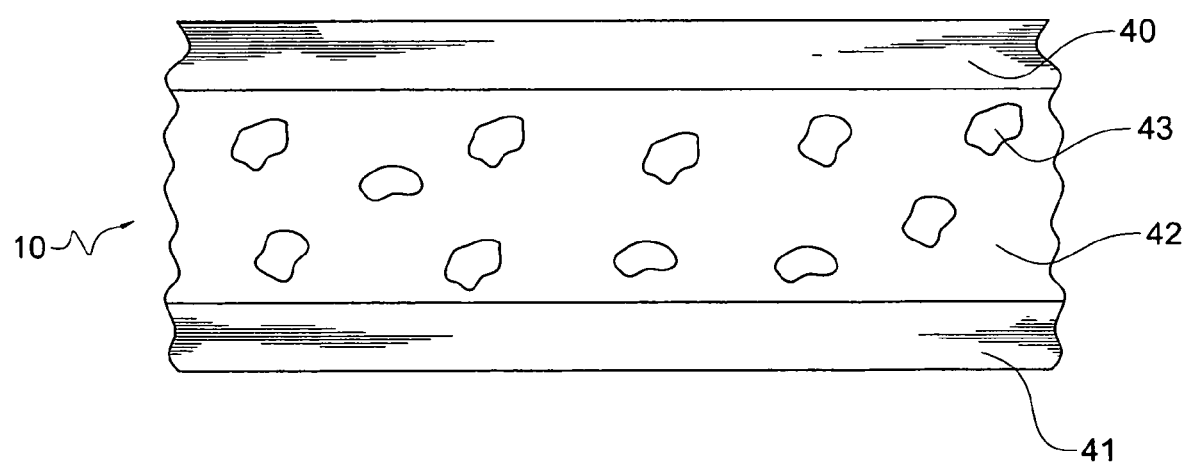
FIG. 4 is a detail view of one embodiment of the present invention.

FIG. 4 depicts a cross-sectional view of an electrically-conductive flexible substrate used in another alternative embodiment of the present invention. Substrate 10 is a flex PC material that has top layer 40, intermediate layer 42, and bottom layer 41. Top layer 40 and bottom layer 41 may comprise any suitable material, such as copper or a copper alloy. Intermediate layer 42 comprises a material, such as a polyimide, dielectric properties and a suitable degree of flexibility. Stabilizing components 43 comprise fillers dispersed in intermediate layer 42. The fillers may be any suitable material capable of increasing the rigidity of intermediate layer 42 without adversely affecting other advantageous properties of intermediate layer 42, including but not limited to metal oxides such as aluminum oxides, silicone dioxides, and titanium oxides and metal nitrides such as aluminum nitrides.

Figure 5:
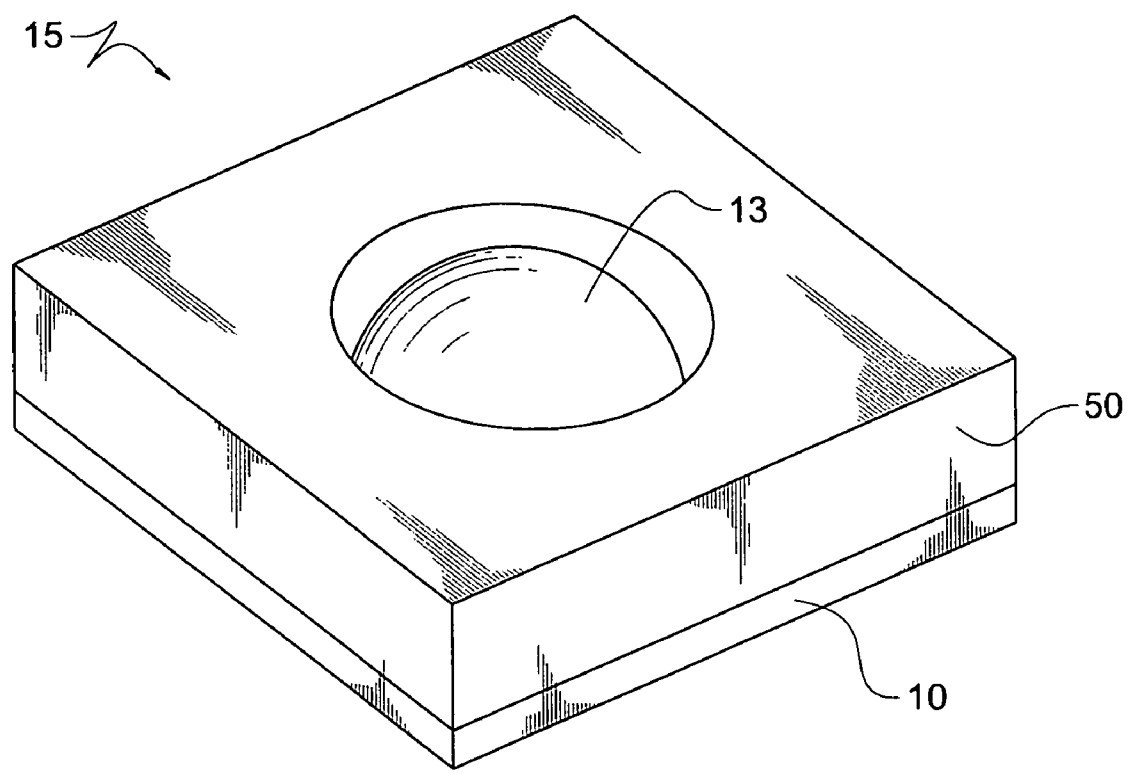
FIG. 5 is a perspective view of one embodiment of the present invention.

FIG. 5 depicts another alternative embodiment of the present invention having an electrical component comprising a conventional flex LED. In this depicted embodiment, dimensionally-distorting component 13 is again comprised of a layer of transparent or translucent and compliant material that forms a dome-shaped structure. Stabilizing component 50 is a housing having a hollow center portion to allow the dome-shaped structure of dimensionally-distorting component 13 to be free from contact with stabilizing component 50. In the embodiment shown in FIG. 5, stabilizing component 50 is attached on top of dimensionally-distorting component 13. Other embodiments may have stabilizing component 50 adjacent to substrate 10 and attached directly on top of substrate 10, and have dimensionally-distorting component 13 attached on top of stabilizing component 50 (i.e., stabilizing component 50 is sandwiched between substrate 10 and dimensionally-distorting component 13). Stabilizing component 50 may comprise any metal, metal alloy (such as, but not limited to aluminum, copper, and iron alloys), ceramics (such as, but not limited to Aluminum Nitride, Aluminum oxides, etc.), or engineered plastics (such as, but not limited to polycarbonate and liquid crystal polymers) that provide rigidity sufficient to improve the dimensional stability of substrate 10. Stabilizing component 50 may be affixed to substrate 10 (or dimensionally-distorting component 13) by any suitable or commercially available affixing agent, such as, but not limited to, solders, epoxies or silicones, or thermally conductive adhesives. In addition, some embodiments may use stabilizing component 50 that comprise reflective portions for reflecting light emitted from the side of the LED.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A dimensionally-stable electronic device, comprising:
an electrically-conductive flexible substrate having a light source mounted thereon, the substrate having a first rigidity;
a volume of transparent or translucent dimensionally distorting material disposed over the light source and at least portions of the substrate, and
at least one dimensionally stabilizing component for reducing a change in one or more dimensions of the substrate otherwise induced by the dimensionally distorting material, the dimensionally stabilizing component comprising a transparent or translucent material having a second rigidity greater than the first rigidity;
wherein the volume of transparent or translucent dimensionally distorting material is interposed between the substrate and the dimensionally stabilizing component, and the dimensionally stabilizing component imparts dimensional stability to the substrate in the presence of the volume of dimensionally distorting material.

2. The device according to claim 1 wherein the at least one stabilizing component comprises at least one strip of rigid material.

3. The device according to claim 2 wherein the at least one strip of rigid material is a polyimide or liquid crystal polymer.

4. The device according to claim 1 wherein the at least one stabilizing component comprises a filler for increasing the internal rigidity of the substrate.

5. The device according to claim 4 wherein the filler is at least one metal oxide.

6. The device according to claim 4 wherein the filler is at least one metal nitride.

7. The device according to claim 1, wherein the light source is electrically connected to the substrate by a wire.

8. The device according to claim 7 wherein the at least one dimensionally stabilizing component comprises at least one metal plate affixed to said substrate.

9. The device of claim 7, wherein the at least one dimensionally stabilizing component comprises at least one strip of rigid material affixed to said substrate.

10. The device of claim 1, wherein the volume of dimensionally distorting material is an encapsulant, silicone, a silicone encapsulant, or a synthetic polymer.

11. The device according to claim 1, wherein the light source is a light emitting diode ("LED").

12. The device according to claim 11, wherein the LED is incorporated into an LED chip.

13. The device according to claim 1, wherein the dimensionally stabilizing component comprises a lens, a rigid lens, a rigid layer, a hard silicone, or an epoxy.

14. The device according to claim 1, wherein the dimensionally stabilizing component partially or totally covers the volume of dimensionally distorting material.

15. The device according to claim 1, wherein the transparent or translucent material of the dimensionally stabilizing component is capable of bonding with the volume of dimensionally distorting material.

16. The device according to claim 1, wherein the dimensionally stabilizing component has a Young's modulus greater than that of the volume of dimensionally distorting material.

17. The device according to claim 1, wherein the substrate is a printed circuit board.

18. The device according to claim 1, wherein the substrate is a flex printed circuit board.

19. The device according to claim 18, wherein the at least one stabilizing component comprises a housing adjacent to the substrate, wherein the housing has an aperture allowing the light source to emit light there through.

* * * * *